(12) United States Patent
Estrada et al.

(10) Patent No.: US 10,886,441 B1
(45) Date of Patent: Jan. 5, 2021

(54) LIGHT EMITTING DEVICE WITH POROUS STRUCTURE TO ENHANCE COLOR POINT SHIFT AS A FUNCTION OF DRIVE CURRENT

(71) Applicant: Lumileds LLC, San Jose, CA (US)

(72) Inventors: Daniel Estrada, Santa Cruz, CA (US); Marcel Rene Bohmer, Eindhoven (NL); Jacobus Johannes Francisus Gerardus Heuts, Roermond (NL); Kentaro Shimizu, Sunnyvale, CA (US); Michael David Camras, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/006,480

(22) Filed: Aug. 28, 2020

Related U.S. Application Data

(63) Continuation of application No. 16/048,440, filed on Jul. 30, 2018, now Pat. No. 10,797,207.

(51) Int. Cl.
    *H01L 33/50*      (2010.01)
    *H01L 33/56*      (2010.01)
    (Continued)

(52) U.S. Cl.
    CPC ............ *H01L 33/502* (2013.01); *H01L 33/44* (2013.01); *H01L 33/501* (2013.01); *H01L 33/56* (2013.01);
(Continued)

(58) Field of Classification Search
CPC . H01L 33/44; H01L 33/46; H01L 33/50–504; H01L 33/52; H01L 33/56; H01L 2933/0091
See application file for complete search history.

(56) References Cited

U.S. PATENT DOCUMENTS

| 7,902,566 B2 | 3/2011 | Paolini et al. |
| 10,030,851 B2 | 7/2018 | Koole et al. |
| (Continued) | | |

FOREIGN PATENT DOCUMENTS

| EP | 2645433 A2 | 10/2013 |
| TW | 201444948 A | 12/2014 |

OTHER PUBLICATIONS

Written Opinion of the International Searching Authority corresponding to PCT/US19/44116, dated Oct. 23, 2019, 8 pages.
(Continued)

*Primary Examiner* — Zandra V Smith
*Assistant Examiner* — Molly K Reida

(57) ABSTRACT

Light emitting devices (LEDs) are described. An LED includes a light emitting semiconductor structure that includes a light emitting active layer disposed between an n-layer and a p-layer. A wavelength converting material may be disposed adjacent the light emitting semiconductor structure. The wavelength converting material includes multiple pores, at least one of which contains a second material. An absolute value of a ratio of a coefficient of thermal expansion of the second material to a coefficient of thermal expansion of the wavelength converting material is at least two in an embodiment, at least ten in another embodiment, at least 100 in another embodiment, and at least 1,000 in yet another embodiment.

20 Claims, 9 Drawing Sheets

(51) Int. Cl.
*H01L 33/44* (2010.01)
*H01L 33/64* (2010.01)

(52) U.S. Cl.
CPC ...... *H01L 33/64* (2013.01); *H01L 2933/0091* (2013.01)

(56) References Cited

U.S. PATENT DOCUMENTS

| | | |
|---|---|---|
| 10,761,246 B2 * | 9/2020 | Bohmer ............... G02B 5/0268 |
| 2002/0030194 A1 | 3/2002 | Camras et al. |
| 2005/0173708 A1 | 8/2005 | Suehiro et al. |
| 2009/0057699 A1 | 3/2009 | Basin et al. |
| 2011/0062469 A1 | 3/2011 | Camras et al. |
| 2011/0227477 A1 | 9/2011 | Zhang et al. |
| 2013/0033168 A1 | 2/2013 | Hseih et al. |
| 2014/0125898 A1 | 5/2014 | Chao et al. |
| 2015/0069299 A1 | 3/2015 | Pan et al. |
| 2016/0163931 A1 | 6/2016 | Schricker et al. |
| 2016/0300985 A1 | 10/2016 | Gootz et al. |
| 2017/0104140 A1 | 4/2017 | Gaska et al. |
| 2018/0053882 A1 | 2/2018 | Cheng et al. |
| 2018/0062052 A1 | 3/2018 | Bohmer et al. |
| 2018/0097158 A1 | 4/2018 | Estrada et al. |
| 2018/0122993 A1 | 5/2018 | Camras et al. |
| 2019/0196069 A1 * | 6/2019 | Bohmer ............... G02B 5/0278 |

OTHER PUBLICATIONS

International Search Report corresponding to PCT/US19/44116, dated Oct. 23, 2019, 4 pages.

Zhang et al., (Phosphor Deposits of β-Sialon:Eu2+Mixed with SnO2 Nanoparticles Fabricated by the Electrophoretic Deposition (EPD) Process, Materials 2014, 7, 3623,3633 (May 6, 2014).

* cited by examiner

LIGHT EMITTING DEVICE WITH POROUS STRUCTURE TO ENHANCE COLOR POINT SHIFT AS A FUNCTION OF DRIVE CURRENT

CROSS REFERENCE TO RELATED APPLICATIONS

This application is a continuation application of U.S. application Ser. No. 16/048,440 which was filed on Jul. 30, 2018. This application is also related to the following: U.S. Pat. No. 10,186,645, issued on Jan. 22, 2019; U.S. Pat. No. 10,276,763, issued on Apr. 30, 2019; and U.S. patent application Ser. No. 15/802,273, which was filed on Nov. 2, 2017.

BACKGROUND

As light moves through two or more materials that have different indices of refraction, the light is reflected to some extent. The larger the difference between the index of refraction of the two or more materials, the larger the reflection (or less transmitted). If the two or more materials have matched or substantially matched indices of refraction, light will pass through the materials with less or no reflection (or more transmitted). If the interface between the different index materials is non-uniform, such as different index particles in a binder or matrix material, then the reflected light may be scattered in many different directions.

SUMMARY

Light emitting devices (LEDs) are described. An LED includes a light emitting semiconductor structure that includes a light emitting active layer disposed between an n-layer and a p-layer. A wavelength converting material may be disposed adjacent the light emitting semiconductor structure. The wavelength converting material includes multiple pores, at least one of which contains a second material. The absolute value of a ratio of a coefficient of thermal expansion of the second material to a coefficient of thermal expansion of the wavelength converting first material is at least two in an embodiment, at least ten in another embodiment, at least 100 in another embodiment, and at least 1,000 in yet another embodiment.

DETAILED DESCRIPTION OF THE PREFERRED EMBODIMENTS

Figure 1A:
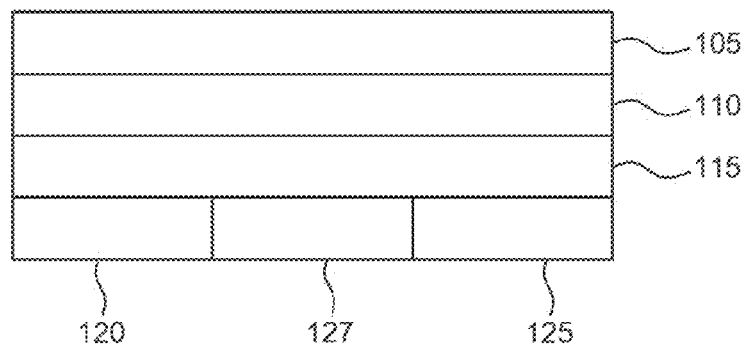
FIG. 1A is a diagram of an example light emitting element (LEE) that includes a light emitting semiconductor structure and a porous structure.

It is sometimes desirable to decrease the correlated color temperature (CCT) of light emitted by the light emitting device (LED) as current and LED temperature are decreased. For example, a CCT of emitted light from some dimmable LEDs may desirably vary (e.g., from 2700 K to 2200K) to create a more cozy and relaxing atmosphere when dimmed. As current is reduced and the bulb is dimmed, the LED light becomes warmer in appearance (lower CCT). The opposite is true when current is increased. As current is increased, the CCT of the emitted light increases and becomes a cooler white.

Modulation of the CCT can be achieved by controlled modulation of the light scattering using two materials with different refractive indices: one material may have a relatively low refractive index with a small dependence of the refractive index on temperature (for example, silica) and another material may have a higher refractive index with a greater dependence of the refractive index on temperature (for example, silicone). For such materials, if the temperature of the materials is increased, the refractive index difference between the first and second materials decreases and, therefore, scattering decreases. This will lead to a shift in color point (lower u') and color temperature (higher CCT).

Embodiments described herein provide for LEDs that take advantage of the scattering effect caused by materials having different temperature dependencies of index of refraction to promote an increase in CCT of emitted light (from warmer to cooler) as drive current and LED temperature increases. In embodiments, at least one layer of the LED structure includes a first material in which pores are present (also referred to herein as a porous structure) and infused with a second material that has a higher coefficient of thermal expansion than the first material. The expansion leads to a more complete filling of the porous structure of the first material at high temperature during curing of the material. Due to a contraction of the second material upon cooling, the second material may delaminate from the pore surface, forming voids or pockets at the interface between the two materials where the pores are not filled with the second material but with a gas or vacuum. These separated regions have a refractive index of about 1.0 and, therefore, have a large refractive index difference between the first and second material, causing additional scattering. The additional scattering causes more of the generated light to be scattered back to the conversion material where it has another chance to be re-absorbed and subsequently re-emitted at longer wavelengths leading to a lower CCT and a warmer white.

A ratio of coefficient of thermal expansion of the second material to a coefficient of thermal expansion of the first material will depend on the materials chosen. For example, silica has a very small CTE on the order of $0.5 \times 10^{-6}/°$ C., whereas silicone has a larger CTE that depends on type and manufacturing process and can range from on the order of 200 to $600 \times 10^{-6}/°$ C. Thus, the CTE ratio of silicone to silica can be on the order of 1,000. YAG has a CTE on the order of $8 \times 10^{-6}/°$ C. Thus, the CTE ratio of silicone to YAG is on the order of 100. Sapphire has a CTE of around $5 \times 10^{-6}/°$ C. and also has a CTE ratio of silicone to sapphire of around 100. Many fluorides, chlorides, bromides, and iodides have a CTE on the order of $30 \times 10^{-6}/°$ C. or greater, such as LiF, NaF, MgF, PbF, KCl, RbCl, NaCl, TlCl, CsBr, KBr, RbBr, TlBr, AgBr, $TlBr_{42}I_{58}$, KI, RbI, and CsI. The CTE ratio of silicone to these fluorides, chlorides, bromides, and iodides are, therefore, around 10. In addition to silicone, urethane, epoxy and mixtures thereof, such as epoxy-silicones, may be used as the fill or infusing second material. Urethane and epoxy have a lower CTE than silicone, with urethanes on the order of 80 to $100 \times 10^{-6}/°$ C. and epoxy as low as $50 \times 10^{-6}/°$ C. Therefore, an epoxy or epoxy-silicone infused fluoride may have a ratio of around 2. Thus, depending on the materials chosen, the CTE ratio of the first material to the second material may be greater than two in some embodiments, greater than ten in some embodiments, greater than 100 in some embodiments and greater than 1,000 in some embodiments.

There are also materials with near zero and negative coefficients of thermal expansion. An example of a near zero CTE material is Schott glass Zerodur® having an expansion of around $0.05 \times 10^{-6}/°$ C. Using this material would give a material 2 to material 1 ratio well over a 1,000 or even over 10,000. Additionally, there are materials that have a negative coefficient of thermal expansion (NTE). That is, these materials contract or shrink with increasing temperature. Some examples of these materials are $MF_3$, where M is Al, Ge, In, Sc, Ti, V, Cr, Mn, Fe, Co, Ir, Rh, or Ru. Most of these materials have a cubic $ReO_3$ structure type. Other examples are oxyfluorides, such as $TaO_2F$, $NbO_2F$, and $TiOF_2$. $ZrW_2O_8$, $NaZr_2P_3O_{12}$ (NZP), $LiO-Al_2O_3-2SiO_2$, $2MgO-2Al_2O_3-5SiO_2$, and $ZrSiO_4$ are more examples of NTE materials. As temperature increases, the expansion of material 2 along with the shrinkage of an NTE material 1 aids in the filling of the voids or gaps to decrease scattering. Similarly, when cooled, the contracting fill or matrix material 2 together with the expanding material 1 would help to create voids and increase scattering. In the case of an NTE material 1, the ratio of CTE of material 2 to material 1 may be negative.

The expression of difference in CTE defined herein as CTE ratio of material 2 to material 1 is arbitrary and may have been defined as CTE ratio of material 1 to material 2, which would have been smaller, from around 0 to 0.5 in absolute value. The difference could also have also been expressed as a true difference in values.

In some embodiments, the porous structure may be a layer of phosphor particles in a transparent binder or matrix or a ceramic phosphor element. When the porous structure is the wavelength converting material itself, the scattering within the porous structure itself may cause more color conversion. In other embodiments, the porous structure may be in a coating of a material disposed over the light emitting element. When the porous structure is filled with the second material, the pocket formation will cause more light to scatter back into the phosphor layer at lower temperatures, causing more color conversion by the wavelength converting material. In any of these embodiments, this may result in a warmer appearance of light emitted by the LED at cooler LED temperatures. As the LED heats up due to application of higher drive current, the scattering decreases and less color conversion occurs. Thus, light emitted by the LED at warmer LED temperatures may appear as a cooler white.

To create the warmer/cooler appearance of emitted light in conventional dimmable LED bulbs, multiple LEDs may be included in the bulbs, many of which may emit light having CCTs in the warm range. At low drive currents, many of the LEDs that emit warm CCT light may be switched on, resulting in the warmer appearing emitted light at lower current/LED temperatures. Such dimmable LEDs may require special drive circuitry to achieve that effect. Embodiments described herein may achieve the same or similar effect with a single color temperature LED and/or with simpler drive circuitry.

FIG. 1A is a diagram of an example light emitting element (LEE) 100 that includes a light emitting semiconductor structure 115, a wavelength converting material 110, and an optional coating 105 on the wavelength converting material 110. Contacts 120 and 125 may be coupled to the light emitting semiconductor structure 115, either directly or via another structure such as a submount, for electrical connection to a circuit board or other substrate or device. In embodiments, the contacts 120 and 125 may be electrically insulated from one another by a gap 127, which may be filled with a dielectric material. The light emitting semiconductor structure 115 may be any light emitting semiconductor structure that emits light that may be converted to light having a different color point via a wavelength converting material. For example, the light emitting semiconductor structure 115 may be formed from III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors have indices of refraction ranging from about 2.4 to about 4.1 at the typical emission wavelengths of LEDs in which they are present. For example, III-Nitride semiconductors, such as GaN, have refractive indices of about 2.4 at 500 nm, and III-Phosphide semiconductors, such as InGaP, have refractive indices of about 3.7 at 600 nm. Contacts 120 and 125 may be formed from a solder, such as AuSn, AuGa, AuSi or SAC solders.

Figure 1B:
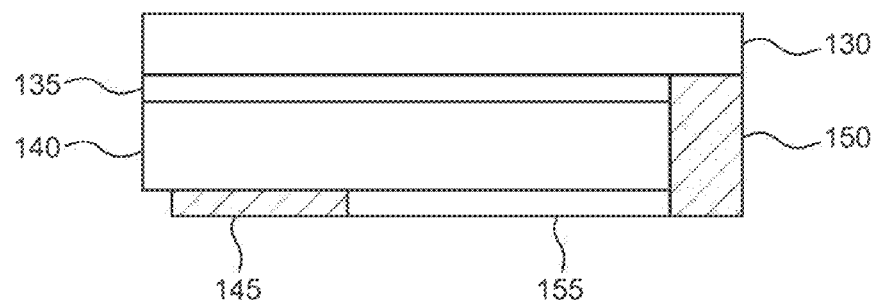
FIG. 1B is a diagram of an example light emitting semiconductor structure that may be included in the LEE of FIG. 1A.

FIG. 1B is a diagram of an example light emitting semiconductor structure 115 that may be included in the LEE 100 of FIG. 1A. The illustrated example is a flip chip structure. However, one of ordinary skill in the art will understand that the embodiments described herein may be applied to other types of LED designs, such as vertical, lateral, and multi junction devices.

In the example illustrated in FIG. 1B, the light emitting semiconductor structure 115 includes a light emitting active region 135 disposed between a semiconductor layer or region of n-type conductivity (also referred to as an n-type region) 130 and a semiconductor layer or region of p-type conductivity (also referred to as a p-type region) 140. Contacts 145 and 150 are disposed in contact with a surface of the light emitting semiconductor structure 115 and electrically insulated from one another by a gap 155, which may be filled by a dielectric material, such as an oxide or nitride of silicon (i.e., $SiO_2$ or $Si_3N_4$). In the illustrated embodiment, contact 145 (also referred to as a p-contact) is in direct contact with a surface of the p-type region 140, and the contact 150 (also referred to as an n-contact) is in direct contact with a surface of the n-type region 130. Although not shown in FIG. 1B, a dielectric material, such as disposed in the gap 155, may also line side walls of the light emitting active region 135 and p-type region 140 to electrically insulate those regions from the contact 150 to prevent shorting of the p-n junction.

The n-type region 130 may be grown on a growth substrate and may include one or more layers of semiconductor material. Such layer or layers may include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Like the n-type region 130, the p-type region 140 may include multiple layers of different composition, thickness, and dopant concentrations, including layers that are not intentionally doped, or n-type layers. While layer 130 is described herein as the n-type region and layer 140 is described herein as the p-type region, the n-type and p-type regions could also be switched without departing from the scope of the embodiments described herein.

The light emitting active region 135 may be, for example, a p-n diode junction associated with the interface of p-region 140 and n-region 135. Alternatively, the light emitting active region 135 may include one or more semiconductor layers that are doped n-type or p-type or are un-doped. For example, the light emitting active region 135 may include a single thick or thin light emitting layer. This includes a homojunction, single heterostructure, double heterostructure, or single quantum well structure. Alternatively, the light emitting active region 135 may be a multiple quantum well light emitting region, which may include multiple quantum well light emitting layers separated by barrier layers.

The p-contact 145 may be formed on a surface of the p-type region 140. The p-contact 145 may include multiple conductive layers, such as a reflective metal and a guard metal, which may prevent or reduce electromigration of the reflective metal. The reflective metal may be silver or any other suitable material, and the guard metal may be TiW or TiWN. The n-contact 150 may be formed in contact with a surface of the n-type region 130 in an area where portions of the active region 135, the n-type region 140, and the p-contact 145 have been removed to expose at least a portion of the surface of the n-type region 130. The sidewall of the exposed mesa or via may be coated with a dielectric to prevent shorting. The contacts 145 and 150 may be, for example, metal contacts formed from metals including, but not limited to, gold, silver, nickel, aluminum, titanium, chromium, platinum, palladium, rhodium, rhenium, ruthenium, tungsten, and mixtures or alloys thereof. In other examples, one or both contacts 145 and 150 may be formed from transparent conductors, such as indium tin oxide.

The n-contact 150 and p-contact 145 are not limited to the arrangement illustrated in FIG. 1B and may be arranged in any number of different ways. In embodiments, one or more n-contact vias may be formed in the light emitting semiconductor structure 115 to make electrical contact between the n-contact 150 and the n-type layer 130. Alternatively, the n-contact 150 and p-contact 145 may be redistributed to form bond pads with a dielectric/metal stack as known in the art. The p-contact 145 and the n-contact 150 may be electrically connected to the contacts 120 and 125 of FIG. 1A, respectively, either directly or via another structure, such as a submount.

The wavelength converting material 110 may be any luminescent material, such as a phosphor, phosphor particles in a transparent or translucent binder or matrix, or a ceramic phosphor element, which absorbs light of one wavelength and emits light of a different wavelength. If the wavelength converting material 110 is a ceramic phosphor element, the ceramic phosphor element may be, for example, a ceramic phosphor plate, such as a platelet of phosphor, for generating one color of light, or a stack of ceramic phosphor platelets for generating different colors of light. The ceramic phosphor plate may have an RI of 1.4 or greater (e.g., 1.7 or greater) at the wavelengths emitted by the light emitting semiconductor structure 115.

The wavelength converting material 110 may be applied in a layer having a thickness that may depend on the wavelength converting material used or other factors related to enhancing the color point shift as a function of drive current as described in more detail below. For example, a layer of wavelength converting material 110 may be approximately 50 μm in thickness while other wavelength converting materials may be formed in layers as thin as 20 μm or as thick as 200 μm. In embodiments, the wavelength converting material 110, such as a ceramic phosphor element, may be pre-formed into a wavelength converting element and attached to the light emitting semiconductor structure 115 using an adhesive or any other method or material known in the art.

In embodiments, the light emitting semiconductor structure 115 emits blue light. In such embodiments, the wavelength converting material 110 may include, for example, a yellow emitting wavelength converting material or green and red emitting wavelength converting materials, which will produce white light when the light emitted by the respective phosphors combines with the blue light emitted by the light emitting semiconductor structure 115. In other embodiments, the light emitting semiconductor structure 115 emits UV light. In such embodiments, the wavelength converting material 110 may include, for example, blue and yellow wavelength converting materials or blue, green and red wavelength converting materials. Wavelength converting materials emitting other colors of light may be added to tailor the spectrum of light emitted from the device 100.

In embodiments, the wavelength converting material 110 may be composed of $Y_3Al_5O_{12}:Ce^{3+}$. The wavelength converting material 110 may be an amber to red emitting rare earth metal-activated oxonitridoalumosilicate of the general formula $(Ca_{1-x-y-z}Sr_xBa_yMg_z)_{1-n}(Al_{1-a+b}Ba)Si_{1-b}N_{3-a}O_b$:$RE_n$ wherein $0 \le x \le 1$, $0 \le y \le 1$, $0 \le z \le 1$, $0 \le a \le 1$, $0 \le b \le 1$ and $0.002 \le n \le 0.2$, and RE may be selected from europium(II) and cerium(III). The phosphor in the ceramic phosphor plate may also be an oxido-nitrido-silicate of general formula $EA_{2-z}Si_{5-a}B_aN_{8-a}O_a:Ln_z$, wherein $0 \le z \le 1$ and $0 < a < 5$, including at least one element EA selected from the group consisting of Mg, Ca, Sr, Ba and Zn and at least one element B selected from the group consisting of Al, Ga and In, and being activated by a lanthanide (Ln) selected from the group consisting of cerium, europium, terbium, praseodymium and mixtures thereof.

In other embodiments, the wavelength converting material 110 may include aluminum garnet phosphors with the general formula $(Lu_{1-x-y-a-b}Y_xGd_y)_3(Al_{1-z}Ga_z)_5O_{12}:Ce_aPr_b$, wherein $0<x<1$, $0<y<1$, $0 \le z \le 0.1$, $0<a \le 0.2$ and $0 \le b \le 0.1$, such as $Lu_3Al_5O_{12}:Ce^{3+}$ and $Y_3Al_5O_{12}:Ce^{3+}$, which emits light in the yellow-green range; and $(Sr_{1-x-y}Ba_xCa_y)_{2-z}Si_{5-a}Al_aN_{8-a}O_a:Eu_z^{2+}$, wherein $0 \le a < 5$, $0 \le x \le 1$, $0 \le y \le 1$, and $0 \le z \le 1$ such as $Sr_2Si_5N_8:Eu^{2+}$, which emits light in the red range. Other green, yellow and red emitting phosphors may also be suitable, including $(Sr_{1-a-b}Ca_bBa_c)Si_xN_yO_z:Eu_a^{2+}$; (a=0.002-0.2, b=0.0-0.25, c=0.0-0.25, x=1.5-2.5, y=1.5-2.5, z=1.5-2.5) including, $SrSi_2N_2O_2:Eu^{2+}$; $(Sr_{1-u-v-x}Mg_u Ca_vBa_y)(Ga_{2-y-z}Al_yIn_zS_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein 0≤x≤1 including, $CaS:Eu^{2+}$ and $SrS:Eu^{2+}$. Other suitable phosphors include, $CaAlSiN_3:Eu^{2+}$, $(Sr,Ca)AlSiN_3:Eu^{2+}$, and $(Sr, Ca, Mg, Ba, Zn)(Al, B, In, Ga)(Si, Ge)N_3:Eu^{2+}$.

In other embodiments, the wavelength conversion material 110 may also have a general formula $(Sr_{1-a-b}Ca_b Ba_cMg_dZn_e)Si_xN_yO_z:Eu_a^{2+}$, wherein 0.002≤a≤0.2, 0.0≤b≤0.25, 0.0≤c≤0.25, 0.0≤d≤0.25, 0.0≤e≤0.25, 1.5≤x≤2.5, 1.5≤y≤2.5 and 1.5≤z≤2.5. The wavelength conversion material may also have a general formula of MmAaBbOoNn:Zz where an element M is one or more bivalent elements, an element A is one or more trivalent elements, an element B is one or more tetravalent elements, O is oxygen that is optional and may not be in the phosphor plate, N is nitrogen, an element Z that is an activator, n=2/3m+a+4/3b−2/3o, wherein m, a, b can all be 1 and o can be 0 and n can be 3. M is one or more elements selected from Mg (magnesium), Ca (calcium), Sr (strontium), Ba (barium) and Zn (zinc), the element A is one or more elements selected from B (boron), Al (aluminum), In (indium) and Ga (gallium), the element B is Si (silicon) and/or Ge (germanium), and the element Z is one or more elements selected from rare earth or transition metals. The element Z is at least one or more elements selected from Eu (europium), Mg (manganese), Sm (samarium) and Ce (cerium). The element A can be Al (aluminum), the element B can be Si (silicon), and the element Z can be Eu (europium).

The wavelength conversion material 110 may also be an $Eu^{2+}$ activated Sr—SiON having the formula $(Sr_{1-a-b}Ca_b Ba_c)Si_xN_yO_x:Eu_a$, wherein a=0.002-0.2, b=0.0-0.25, c=0.0-0.25, x=1.5-2.5, y=1.5-2.5.

The wavelength conversion material 110 may also be a chemically-altered Ce:YAG (Yttrium Aluminum Garnet) phosphor that is produced by doping the Ce:YAG phosphor with the trivalent ion of praseodymium (Pr). The wavelength conversion material 110 may include a main fluorescent material and a supplemental fluorescent material. The main fluorescent material may be a Ce: YAG phosphor and the supplementary fluorescent material may be europium (Eu) activated strontium sulfide (SrS) phosphor ("Eu:SrS"). The main fluorescence material may also be a Ce: YAG phosphor or any other suitable yellow-emitting phosphor, and the supplementary fluorescent material may also be a mixed ternary crystalline material of calcium sulfide (CaS) and strontium sulfide (SrS) activated with europium $((Ca_xSr_{1-x})S:Eu^{2+})$. The main fluorescent material may also be a Ce:YAG phosphor or any other suitable yellow-emitting phosphor, and the supplementary fluorescent material may also be a nitrido-silicate doped with europium. The nitrido-silicate supplementary fluorescent material may have the chemical formula $(Sr_{1-x-y-z}Ba_xCa_y)_2Si_5N_8:Euz^{2+}$ where 0≤x, y≤0.5 and 0≤z≤0.1.

In embodiments, the wavelength conversion material 110 may include strontium-lithium-aluminum: europium (II) ion $(SrLiAl_3 N_4:Eu^{2+})$ class (also referred to as SLA), including $MLiAl_3N_4:Eu^{2+}$ (M=Sr, Ba, Ca, Mg). In a specific embodiment, the luminescent particles may be selected from the following group of luminescent material systems: $MLiAl_3N_4:Eu$ (M=Sr, Ba, Ca, Mg), $M_2SiO_4:Eu$ (M=Ba, Sr, Ca), $MSe_{1-x}S_x:Eu$ (M=Sr, Ca, Mg), $MSr_2S_4:Eu$ (M=Sr, Ca), $M_2SiF_6:Mn$ (M=Na, K, Rb), $M_2TiF_6:Mn$ (M=Na, K, Rb), $MSiAlN_3:Eu$ (M=Ca, Sr), $M_8Mg(SiO_4)_4Cl_2:Eu$ (M=Ca, Sr), $M_3MgSi_2O_8:Eu$ (M=Sr, Ba, Ca), $MSi_2O_2N_2:Eu$ (M=Ba, Sr, Ca), $M_2Si_{5-x}Al_xO_xN_{8-x}:Eu$ (M=Sr, Ca, Ba). However, other systems may also be of interest and may be protected by a coating. Also combinations of particles of two or more different luminescent materials may be applied, such as e.g. a green or a yellow luminescent material in combination with a red luminescent material.

In embodiments, the wavelength conversion material 110 may be a blend of any of the above-described phosphors.

Figure 2A:
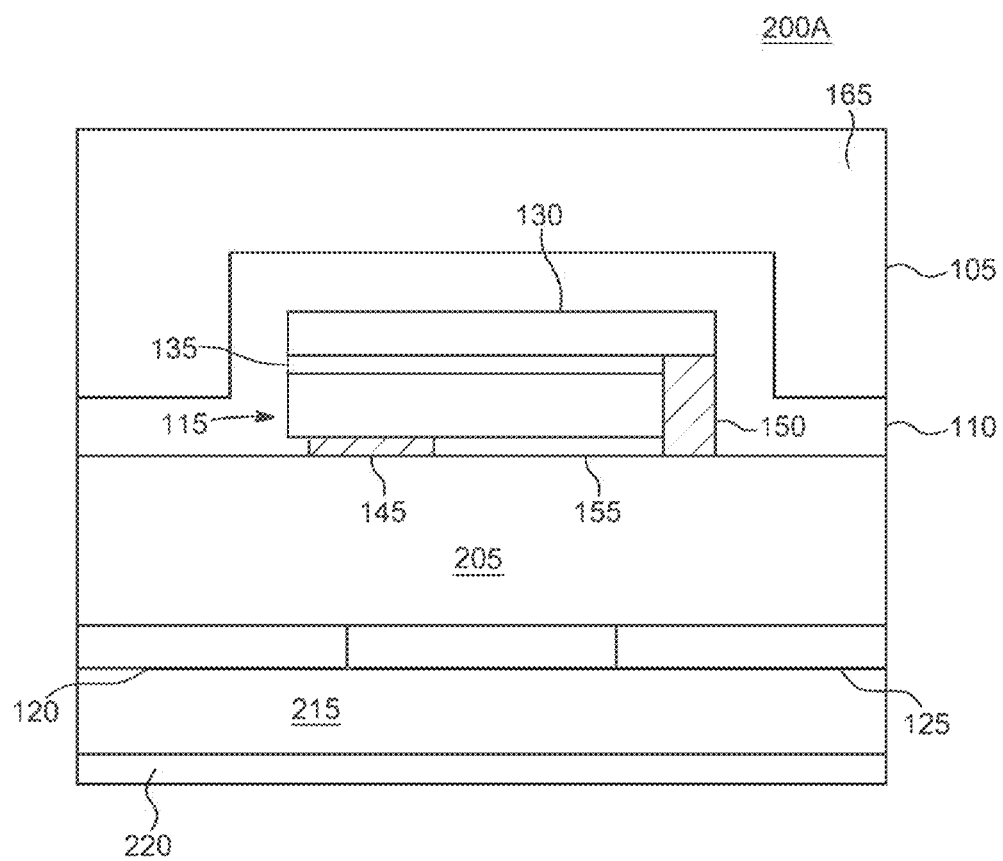
FIG. 2A is a diagram of an example light emitting device (LED) that may include the LEE of FIG. 1A.

FIG. 2A is a diagram of an example light emitting device (LED) 200A. In the example illustrated in FIG. 2A, the LED 200A includes the light emitting semiconductor structure 115 of FIG. 1B, which is mounted to a submount 205 that includes the contacts 120 and 125. The light emitting semiconductor structure 115 may be mounted to the submount 205 by an electrical coupling between the contacts 145 and 150 on the light emitting semiconductor structure 115 and submount electrodes on an adjacent surface of the submount 205 (not shown in FIG. 2A). The submount electrodes may be electrically connected by vias (not shown) to the contacts 120 and 125 on the opposite surface of the submount 205. In embodiments, the LED 200A may be mounted to a printed circuit board (PCB) 215. In such embodiments, the submount 205 may be mounted via the contacts 120 and 125 to the PCB 215. Metal traces on the circuit board may electrically couple the contacts 120 and 125 to a power supply, such that an operational or drive voltage and current may be applied to the LED when it is desired to turn the LED on.

The submount 205 may be formed from any suitable material, such as ceramic, Si, or aluminum. If the submount material is conductive, an insulating material may be disposed over the substrate material, and the metal electrode pattern may be formed over the insulating material. The submount 205 may act as a mechanical support, provide an electrical interface between the n and p electrodes on the LED chip and a power supply, and provide heat sinking. In embodiments, a heat sink may alternatively or additionally be provided on the PCB 215, such as a metal core PCB-MCPCB heat sink 220 illustrated in FIG. 2A. While the heat sink 220 is illustrated in FIG. 2A as being attached to the bottom of the PCB 215, one of ordinary skill in the art will recognize that other arrangements are possible without departing from the scope of the embodiments described herein.

In the example LED 200A, the wavelength converting material 110 completely surrounds the light emitting semiconductor structure 115 on all surfaces except the surface that electrically connects the light emitting semiconductor structure 115 to the submount 205. The optional coating 105 may be disposed in direct contact with the wavelength converting material 110. The coating may not be a separate layer, may be a coating on the individual phosphor particles or may be formed on the ceramic phosphor, and this coating may include pores. These pores may be filled with a binder or matrix material and may be part of the wavelength converter 110. Coatings of phosphor materials are described in U.S. patent application Ser. No. 15/802,273, which was filed on Nov. 2, 2017 and is incorporated by reference herein in its entirety. Phosphor coatings of sol-gel, atomic layer deposition (ALD), evaporation, sputtering, dip and dry, or spin coating methods include $SiO_2$, $Al_2O_3$, $HfO_2$, $Ta_2O_5$, $Z_rO_2$, $T_iO_2$, $Y_2O_3$, and $Nb_2O_5$. Coatings may be thick enough to include pores that may be formed during or after deposition.

Figure 2B:
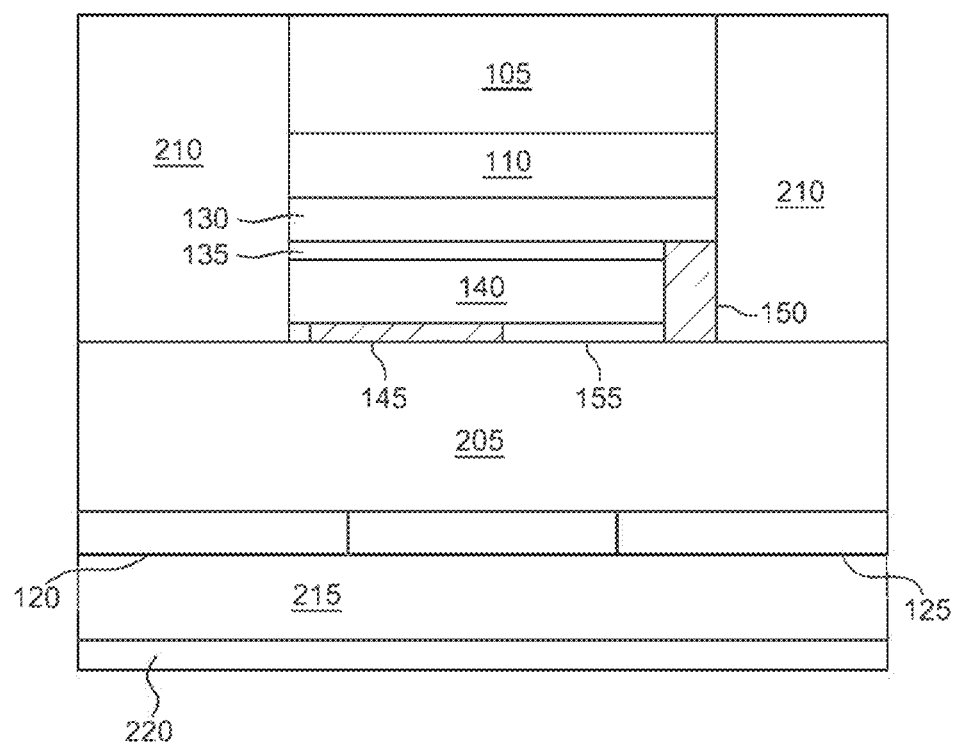
FIG. 2B is a diagram of another example LED that may include the LEE of FIG. 1A.

FIG. 2B is a diagram of another example LED 200B. In the example LED 200B, the wavelength converting material 110 is deposited on the light emitting semiconductor structure 115. The optional coating 105 may be disposed in direct contact with the wavelength converting material 110. A structure 210, such as a frame, is disposed adjacent side surfaces of a stack formed by the light emitting semiconductor structure 115, the wavelength converting material 110 and the optional coating 105 and may surround the stack. The entire structure 210, but at least inner surfaces of the structure 210 that are adjacent the stack, may be formed from or coated in a light reflecting material, such as an interference layer or a strongly scattering layer, to further minimize absorption of any scattered light.

One or both of the wavelength converting material 110 and the optional coating 105, which may be a partial coating, a ceramic coating or a separate layer coating 105 of the first material, may be the porous structure described above and, thus, may include pores or voids that contain the second material (having a much higher coefficient of thermal expansion than the first material, as described in detail above). An example of such a first material may be silicone. Pockets may form within the pores of the porous structure as the LED cools to create optical scattering.

For the pores to be filled with a second material, such as a silicone material, a solid material open porosity is used, such as silica particles with open porosity. The porous particles or material may be infused with the second material, and the second material may be subsequently cured. Because of the high thermal expansion coefficient, the cross-linked second material may fill up the porous structure completely at the curing temperature. An often used curing temperature is 150° C. Upon cooling down, the second material may shrink again. This may lead to the formation of pockets in the porous particles due to silicone delamination from the phosphor, coating or scattering particle pores, which may cause the scattering at low temperature.

When an operational or drive current is applied to turn on the LED, the pockets may disappear as the device heats to or past a particular temperature such that little light scattering occurs. FIGS. 3A, 3B, 4A, 4B, 5A, 5B, 5C, 5D and 6 provide specific examples of porous structures that may be included in LEDs, such as the LEDs 200A and 200B, and illustrate how the filled porous structures change as a function of temperature/current. The examples illustrated in FIGS. 3A, 3B, 4A, 4B, 5A, 5B, 5C, 5D and 6 are images of a sample of silicone with embedded porous silica particles, which may be used as the porous structure in embodiments. However, instead of the porous silica particles shown as an illustrated example, porous phosphor particles, phosphor particles with a porous coating, porous ceramic phosphor, or ceramic phosphor with a porous coating could be used in an actual device.

Figure 3A:
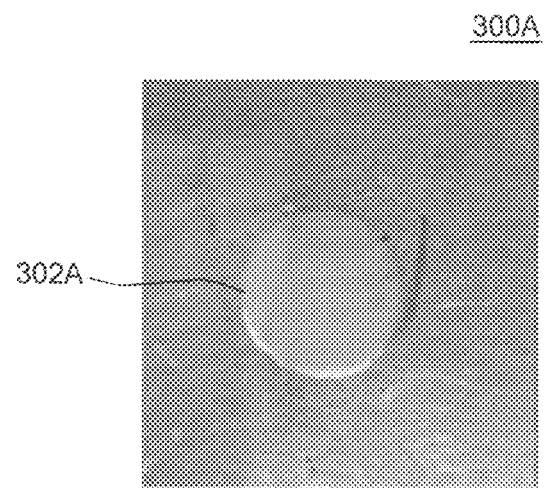
FIGS. 3A and 3B are images of a droplet of a sample of silicone with embedded porous silica particles showing the effects of rapid and slow cooling of the sample without high magnification.
Figure 3B:
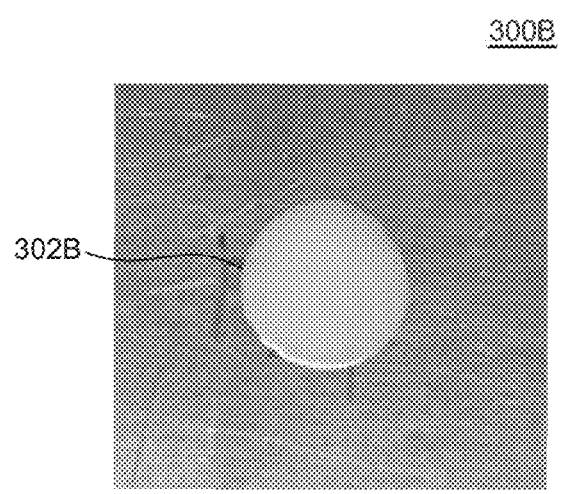

FIGS. 3A and 3B are images 300A and 300B of a droplet 302A and 302B of a sample of silicone with embedded porous silica particles showing the effects of rapid and slow cooling of the sample without a microscope. The diameter of the droplet 302A/302B in FIGS. 3A and 3B is approximately 8 mm. FIG. 3A shows the droplet 302A when heated and cooled in an oven. Cooling in the oven was performed very slowly (e.g., from 150° C., the droplet was cooled down from the curing temperature slowly). FIG. 3B shows the droplet 302B after heating to 200° C. on a hotplate, removing the sample, and cooling it rapidly, such as by allowing it to cool on an aluminum plate at room temperature. As can be seen from FIGS. 3A and 3B, the quickly cooled droplet 302B has a whiter appearance than the slowly cooled droplet 302A. The whiter appearance of the droplet 302B may be due to pockets formed in the pores during the rapid cooling.

As these images were taken without using a microscope, the pockets cannot be seen in FIG. 3B, but the optical effect of the pocket formation (increased whiteness) is visible. The white appearing material scatters more light compared to the more transparent silicone that has not been heated and cooled or that has been heated and cooled very slowly.

Figure 4A:
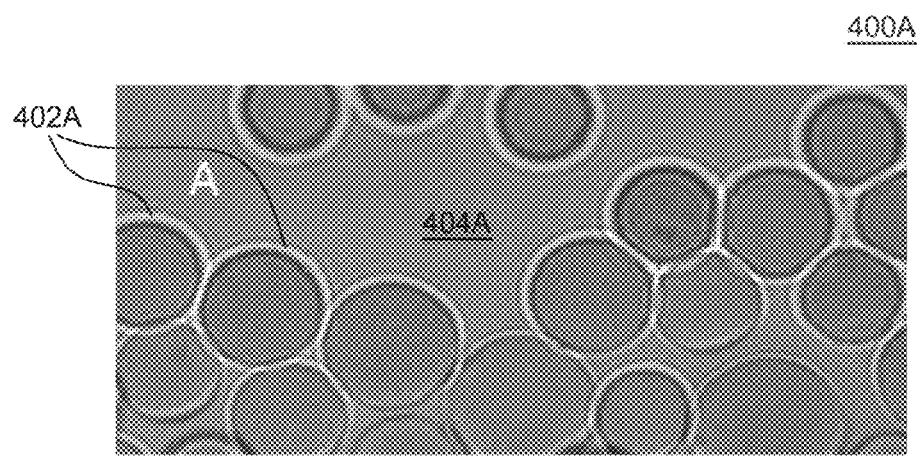
FIGS. 4A and 4B are images of the sample of silicone with embedded porous silica particles showing the effects of rapid and slow cooling of the sample with magnification.
Figure 4B:
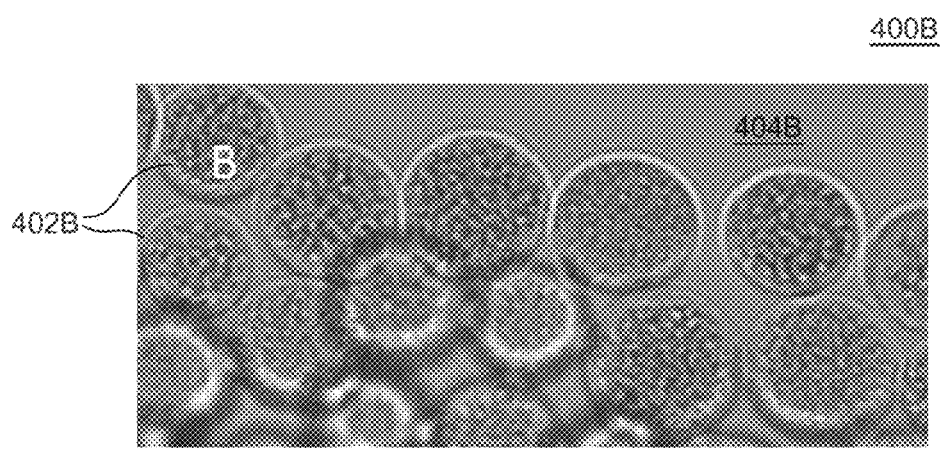

FIGS. 4A and 4B are images 400A and 400B of the sample of silicone 404A and 404B with embedded porous silica particles 402A and 402B under higher magnification with light being transmitted through the particles enabling the silica particles 402A and 402B of nominally 10 µm in diameter to be seen. FIG. 4A shows the sample when subjected to slow cooling in the oven. As can be seen, the silica particles 402A appear homogenous. FIG. 4B shows the sample after rapid cooling. As can be seen, pockets are formed in the silica particles 402B, and the silica particles 402B do not appear homogenous. The difference in refractive index between the pockets and surrounding silica/silicone material creates the scattering effect after the device has been subjected to the rapid cooling.

Figure 5A:
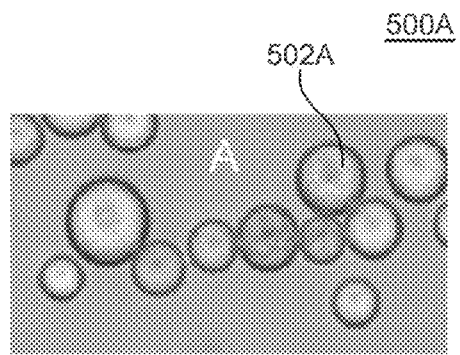
FIGS. 5A, 5B, 5C and 5D are images of the sample of silicone with embedded porous silica particles showing changes to the internal structure of the silica particles during re-heating and slow and rapid cooling of the sample on a length scale that the internal structure can be detected with light microscopy.
Figure 5B:
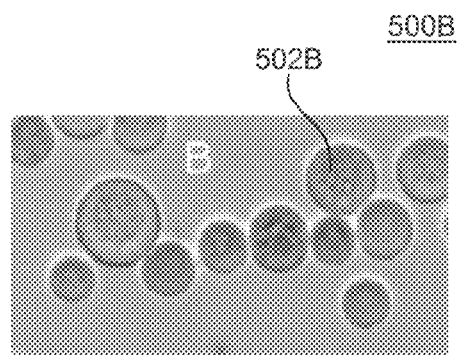
Figure 5C:
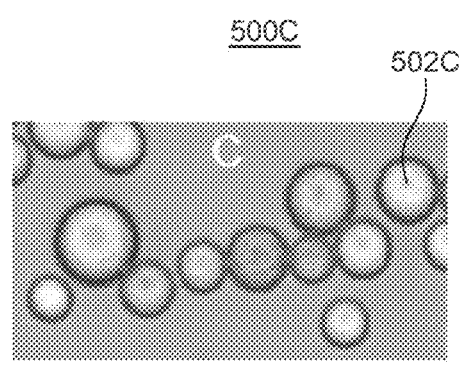
Figure 5D:
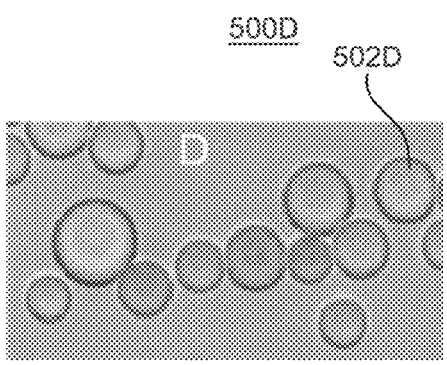

FIGS. 5A, 5B, 5C and 5D are images 500A, 500B, 500C, and 500D of the sample of silicone with embedded porous silica particles 502A, 502B, 502C and 502D taken optically using transmitted light at around 1000× magnification. FIGS. 5A and 5C show the sample at the start of two separate experiments. In both FIGS. 5A and 5C, the image was captured at room temperature after the sample had already been heated and rapidly cooled. FIG. 5B shows the sample after heating up and cooling down at 50° C./minute (e.g., rapid cooling). FIG. 5D shows the sample after heating up and cooling down at 5° C./minute (e.g., slow cooling).

The observation under the microscope is that the structure is seen for rapid cooling (FIGS. 5A, 5B and 5D). This means that there are refractive index differences present within the particles on a length scale such that they can be detected with visible light. Such a structure is not present after slow cooling and no material has been added (FIG. 5B), and this can be explained by new light scattering entities, which are air voids inside the porous particles. Partially, the pores of the solid material are not filled with silicone but with air, gas or vacuum.

The silica particles with an open porosity homogenously filled with silicone do not show such a structure, even though refractive index differences exist at room temperature between the solid material and the silicone. This is because the refractive index difference between the materials is small (1.55 vs. 1.46) and the pore size is smaller than the wavelength of light used for detection. The structure that is detected after fast cooling down demonstrates that a different morphology results after fast cooling: differences in refractive index are present of at least on the length scale of the wavelength of visible light that is used here for detection.

Figure 6:
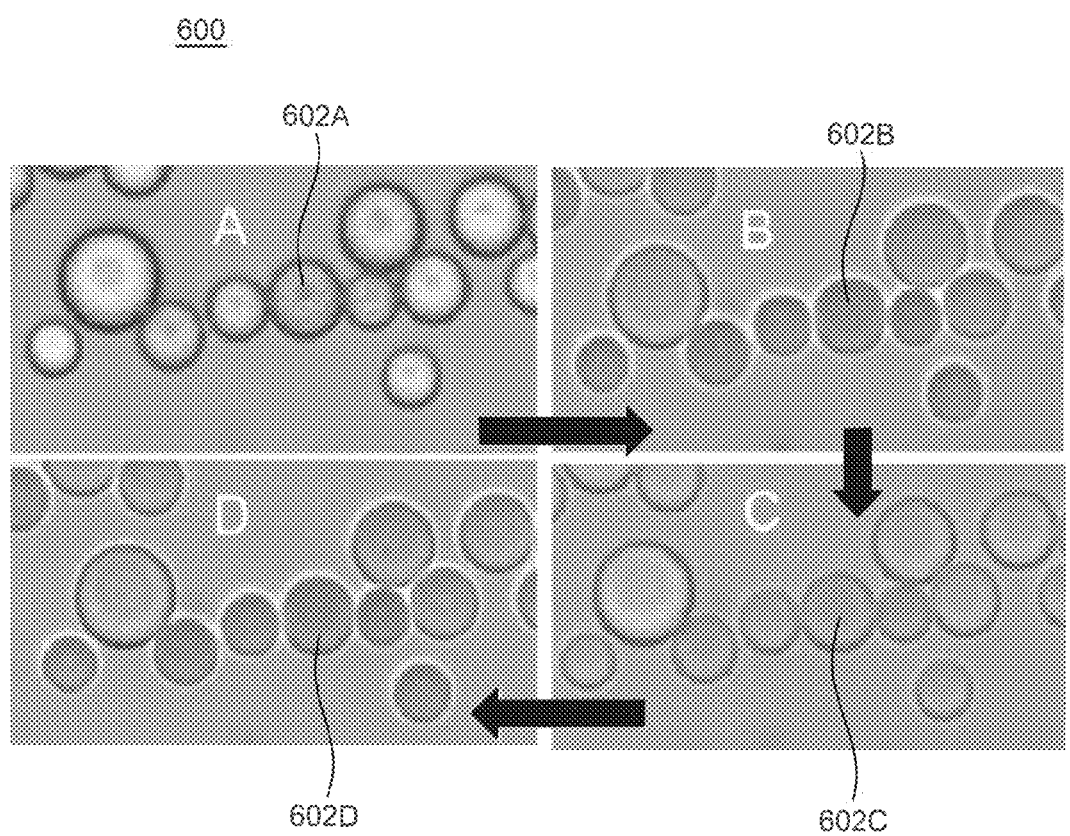
FIG. 6 is four images of the same sample of silicone with embedded porous silica particles showing the effects of the entire re-heating and rapid cooling cycle on the sample in which scattering due to pockets are visibly present in the porous structure at the beginning of the re-heating.

FIG. 6 shows four images A, B, C and D taken of the sample of silicone with embedded porous silica particles of around 10 µm in diameter using optical transmission microscopy. In FIG. 6, the images A, B, C and D show changes in the sample over a full cycle of heating and rapid cooling. In image A, the sample is shown at 75° C. with pockets formed in the particles 602A. As can be seen in image B, when the sample has been heated to 125° C., the pockets within the particles 602B are filled, the scattering centers are gone, and the particles appear homogenous. Heating continues at 200° C. and is then cooled to 125° C. In image C taken at 125° C., the particles 602C still appear homogenous. When the device is cooled to 75° C. during rapid cooling in image D, the pockets within the particle cores 602D have not yet re-appeared. Cooling further to room temperature 25° C., the material will have the same appearance as in FIG. 5A as the pockets form and scattering is once again apparent at low temperatures.

From FIGS. 3A, 3B, 4A, 4B, 5A, 5B, 5C, 5D and 6, it can be seen that, for a porous silica material having pores infused with a silicone material, pockets may be formed within the pores of the silica when the LED is heated and rapidly cooled. In terms of an actual LED device, the LED device will naturally heat and cool rapidly as current is increased and decreased such that pockets will form when drive current to the LED is decreased. In embodiments, heating and cooling of the LED may be controlled (if desired), for example, by choosing an appropriate heat sink (e.g., heatsink 220 in FIGS. 2A and 2B or other heatsink, such as heatsinking via submount 205) or controlling the rate at which current to the LED is increased or decreased.

It can also be seen from FIGS. 3A, 3B, 4A, 4B, 5A, 5B, 5C, 5D and 6 that, if desirable, the pockets can be eliminated from the pores by heating and then slowly cooling the LED. More specifically, during the various heating and cooling cycles, air pockets disappeared when the LED was heated to between 75° C. and 125° C. Air pockets did not re-appear until temperature is then cooled below 75° C. with a fast cooling rate. The air pockets can be made to not re-appear when the LED was cooled at a slow cooling rate of 5° C. per minute. Thus, the process of pocket formation within the pores is reversible, if desired. The hysteresis in the appearance of the scattering, >75° C. during heat up and <75° C. during cool down, is dependent on the particle size chosen and the type of silicone used.

Figure 7:
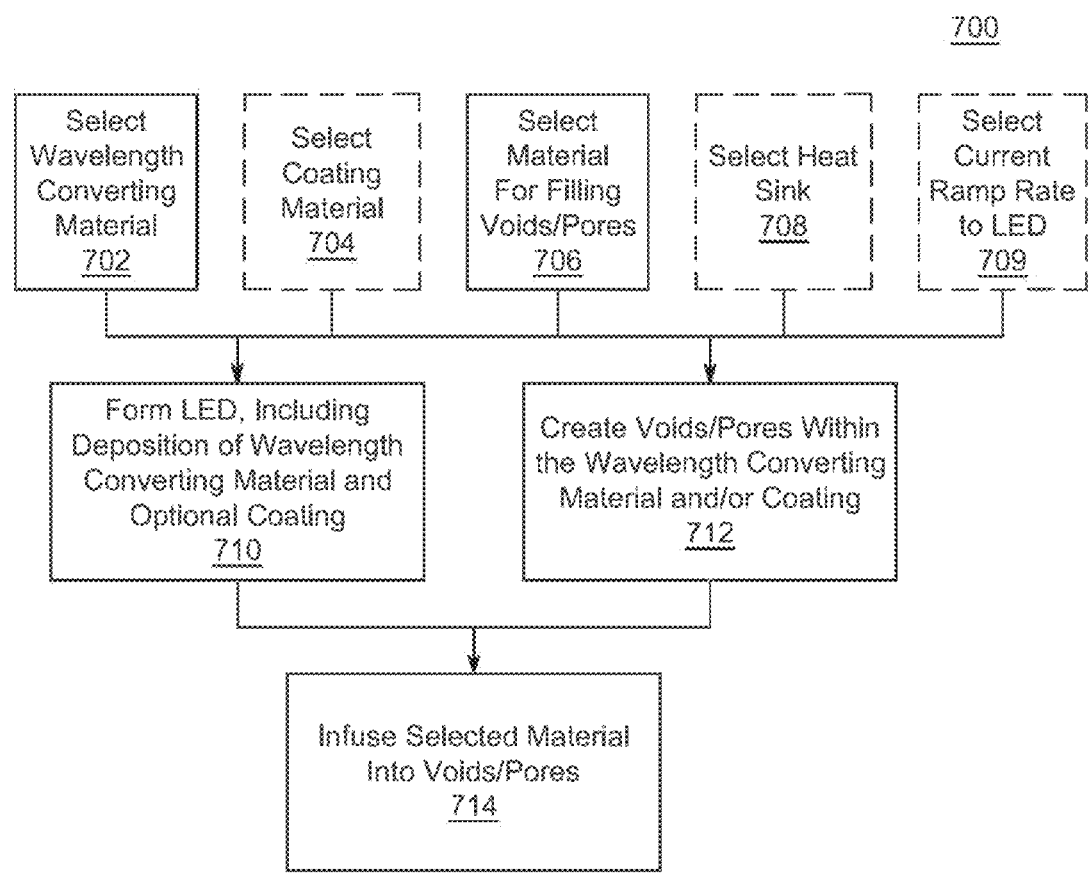
FIG. 7 is a flow diagram of an example method of manufacturing an LED with a porous structure to enhance color point shift with drive current.

FIG. 7 is a flow diagram 700 of an example method of manufacturing an LED with a porous structure to enhance CCT shift with drive current. In the example illustrated in FIG. 7, a wavelength converting material (702), a coating material (if applicable) (704), and a second material for filling or infusing into the voids/pores (706) may be chosen. In general, the various materials may be chosen to provide close matching of index of refraction among them when the LED is fully heated. The second material for filling or infusing into the voids/pores should have a coefficient of thermal expansion chosen such that a ratio of coefficient of thermal expansion of the second material to a coefficient of thermal expansion of the wavelength converting material or coating is at least two in some embodiments, at least ten in some embodiments, at least 100 in some embodiments, and at least 1,000 in some embodiments. Silicones typically provide such properties and may be suitable for use in the pores. Specific parameters that may be considered when choosing such materials are described in more detail below.

A heat sink may also be chosen (708) (if desired or required). The factors to be considered when choosing a heat sink are described in detail above. Additionally or alternatively, a current ramp rate to the LED may be selected (709) (if desired or required). The LED may be formed using the chosen material(s) for the wavelength converting material and optional coating (710). Voids/pores may be formed within the wavelength converting material and/or the coating (712). The selected material may then be infused into the voids/pores (714). Details regarding pore/void formation and infusion are provided below.

In embodiments, the pores may be formed in the optional coating 105 or in the wavelength converting material 110. The wavelength converting material 110 may be either a separately formed ceramic wavelength converting element or a layer of phosphor particles in a transparent or translucent binder or matrix. In each embodiment, while the materials used may be different, the switching effect of the creation and disappearance of pockets in the pores as a function of drive current may be similar to that described above with respect to FIGS. 3A, 3B, 4A, 4B, 5A, 5B, 5C, 5D and 6.

As previously mentioned, the porous structure may be the wavelength converting material 110, which may be a ceramic phosphor element or a layer of phosphor particles in a transparent or translucent matrix or binder. A ceramic phosphor platelet or layer of phosphor particles, for example, may range in thickness from a minimum of 10 µm to a maximum 500 µm and may, in embodiments, be in the range of 100 µm to 200 µm or 100 µm to 300 µm. A ceramic platelet may, for example, range from approximately 50 µm to approximately 500 µm, and a phosphor layer may be thinner, starting, for example, at approximately 10 µm. Platelet or layer thickness may depend on the desired color conversion and activator concentration in the converter. Additionally or alternatively, the porous structure may be the coating.

The porosity may be created uniformly throughout the entire thickness of the ceramic phosphor platelet, phosphor particles or coating or may be non-uniform. Where the porosity is non-uniform, for example, the ceramic phosphor platelet, phosphor particles or coating may be graded in porosity through the entire, or a portion of, the thickness of the ceramic phosphor platelet, phosphor particles or coating. Alternatively, a surface treatment may be applied to the ceramic phosphor platelet, phosphor particles or coating to create a more porous surface that extends a pre-determined depth into the thickness. For example, pores may cover all surfaces of the ceramic phosphor platelet, phosphor particles or coating, may extend deep into the ceramic phosphor platelet, phosphor particles or coating, may connect to other pores, and/or may extend throughout the ceramic phosphor platelet, phosphor particles or coating so as to connect one surface to another.

For pores to be filled with the second material, pores at the surface that either dead end at some depth beneath the surface, cross link to other pores or throat from one surface to another may be filled with the second material and used for scattering as a function of temperature (also referred to as "useful pores"). Isolated pores below the surface that are not connected or linked to pores that extend to a surface may not be able to be filled with the second material and, therefore, may not be used in the change in scattering as a function of temperature, although they may increase scattering at all temperatures. The useful pores may greatly increase the surface area of the ceramic platelet, phosphor particles or coating, greatly increasing the degree of scattering as a function of temperature.

To create porosity in embodiments where the porous structure is the ceramic phosphor element, the pores may be created during formation of the ceramic, such as by adjusting the homogeneity and packing density of the unfired or green pre-reacted phosphor particles during shape formation, sintering and optional hot pressing, hot isostatic pressing, gas pressure sintering, or spark plasma sintering.

Parameters affecting porosity for the green body may include particle size distribution, surface area, particle morphology, degree and strength of particle agglomeration, method and density of shape formation that includes cold isostatic or uniaxial pressing, tape or slip casting, and extrusion or injection molding. Adjusting these processing factors along with the sintering or firing process, the pore content, pore size, microstructure, and optical properties, may be tailored.

Alternatively, or additionally, the final (fired) ceramic phosphor may be modified by mechanical or chemical etching or roughening. Etching may be dry or wet and may be photo-chemically and/or electro-chemically enhanced. Mechanical and chemical strength and time may be adjusted to create additional porosity on a top surface to a desired depth in the ceramic.

To create porosity in embodiments where the porous structure is phosphor particles or a coating, porosity or voids may be created within the particular coating during formation by controlling reaction parameters. Alternatively, the pores or voids may be created after formation, for example, using any suitable method, such as described above with respect to mechanical or chemical etching or roughening.

In all embodiments, the porosity of the ceramic phosphor platelet, the phosphor particles, or the coating may be tailored to provide an optimum degree of scattering as a function of temperature for a particular application. For example, a 1 mm×1 mm×0.1 mm platelet may have opposing surfaces (e.g., a top surface and a bottom surface) connected by side surfaces (e.g., four side surfaces) that each represent about 41.7% of the total surface area of the platelet and, together, represent about 83.4% of the total platelet area. The side surfaces may represent the remaining area of about 16.6%. The platelet surface closest to the LED may have pores infused with a different silicone, such as a lower molecular weight or lower index silicone, for example, with fewer phenyl groups and more methyl groups, than the silicone that surrounds the side surfaces or the opposing surface.

Increasing the porosity of the platelet, particles or coating may increase the surface area in contact with silicone, for example, by many orders of magnitude. Pore diameter within the platelet, layer or coating may range from 0.5 nm to 50 nm in embodiments, 1 nm to 10 nm in embodiments, 10 nm to 10 μm in embodiments, 10 nm to 0.5 μm in embodiments, or 50 nm to 0.5 μm in embodiments. The smaller diameters may be chosen based on the ability of some materials to wet atom or monolayer sized pores, and the larger size may be chosen based on the thickness of the platelet, phosphor particle size or coating thickness. Porosity may be defined in its usual way as a ratio of the volume of void space to the total or bulk volume of the material such that, for example, a non-porous material having no voids would have a porosity of zero, whereas a very porous material containing mostly voids would have a porosity approaching 1.

In embodiments, porosity of the platelet, particles or coating may range from 0 to 0.8 in embodiments, 0 to 0.05 in embodiments, 0 to 0.1 in embodiments, 0 to 0.5 in embodiments, 0.01 to 0.1 in embodiments, and 0.01 to 0.05 in embodiments. The effective pore diameter may determine the size of the pockets. Pockets may effectively scatter light as small as approximately ¼ of the wavelength of light in the solid. For example, a short wavelength light of 400 nm in a higher index matrix, such as a ceramic phosphor of 1.8 index, a pocket size of around 50 nm may scatter. However, shorter wavelength light in a higher index matrix, such as 380 nm in a 2.2 index material would give a smaller pocket size of around 40 nm that may scatter the light. Pockets may be approximately 30 nm or larger for short wavelength light in a semiconductor converter, for example with a higher index of refraction, or in other embodiments may be approximately 50 nm or larger, 100 nm or larger, and 200 nm or larger.

In engineering materials used for the converters, optional coatings and the second material, many factors must be considered to create the desired scattering versus temperature characteristic. Such factors may include refractive index, pore size, distribution, and porosity of the converter, together with viscosity, wetting agents, and index of the second material (e.g., silicone or otherwise suitable material). Further, the porosity and microstructure of the converter may affect the external quantum efficiency, color point, and color over angle and may also be considered.

As mentioned above, the pores may be filled or infused with a second material to create sites that are susceptible to phosphor or other material silicone delamination once the system cools and the silicone contracts. The contraction may form pockets that have a refractive index of approximately 1.0 and cause an overall increase of scattering at lower temperatures. Once heated, the silicone expands and fills the voids, decreasing the overall scattering of the system. In embodiments, the second material may be silicone. The properties of the silicone, such as refractive index, viscosity, and wettability, may be adjusted to produce the desired change in scattering as a function of temperature to yield the desired color change with temperature/current, such as warm dimming.

In embodiments where a coating, such as optional coating 105, is included in the LED, the coating may be deposited on a layer of phosphor particles or ceramic phosphor (e.g., wavelength converting material 110), and the voids or pores may be created in the coating in addition to, or instead of, the voids or pores created in the layer of phosphor particles or ceramic phosphor. The coating may have an index of refraction that matches that of the phosphor material on which it is coated or may have an index of refraction that is lower or higher than that of the phosphor particle layer or ceramic phosphor. The index of refraction of the phosphor materials that may be used for wavelength converting material 110 may vary widely. For example, red emitting $K_2(Ti,Si)F_6$:Mn or $M_2(Ti,Si)F_6$:Mn (M=Na, K, Rb) may have an index of refraction of around 1.4, yellow-green emitting garnets may have an index of refraction of around 1.8, and orange-red emitting nitridosilicates may have an index of refraction above 2.0 The material for the coating may be, for example, silica, which has an index of refraction of around 1.4, AlOx, including $Al_2O_3$ and MgO, which have an index of refraction of around 1.8, and SiON, SiAlON, $Si_3N_4$, $HfO_2$, $Ta_2O_5$, $ZnO_2$, $Y_2O_3$, which have an index of refraction above 2.0.

Coatings may be deposited by any method known in the art, such as a sol gel process, atomic layer deposition (ALD), chemical vapor deposition (CVD), plasma-enhanced CVD (PECVD), sputtering, thermal evaporation, or e-beam evaporation with or without ion beam assist. The coating may vary in thickness from sub-micron to 10s of microns or even 100s of microns. Coating materials may include, for example, oxides, nitrides, carbides, borides, fluorides, arsenides, phosphides, and antimonides. In embodiments, coatings may be single or multi-layer coatings of various materials. The filling or infusion of silicone or other material into the voids or pores of the coating may be as described above for the ceramic phosphor.

Figure 8:
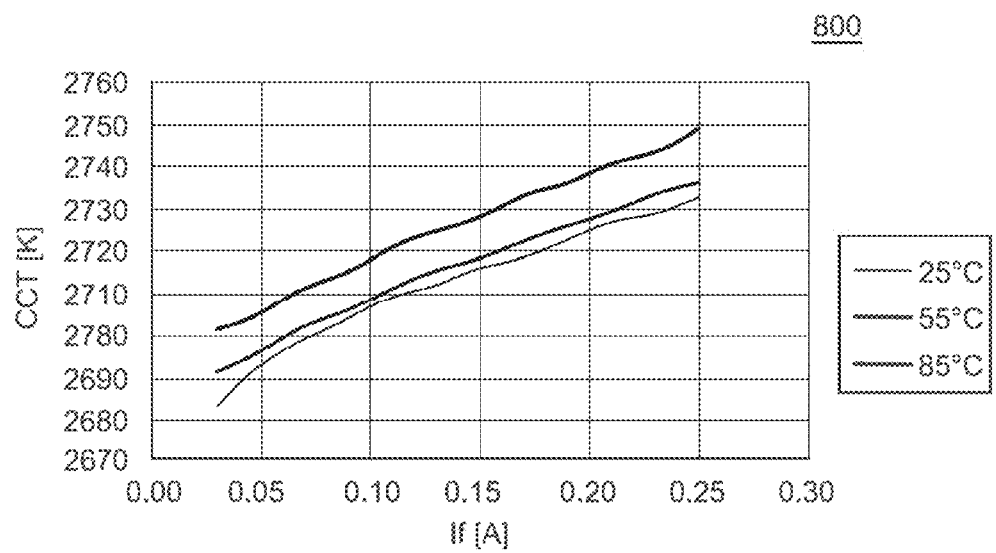
FIGS. 8 and 9 are graphs illustrating the effect of temperature on CCT of light emitted by an LED with and without a porous structure.
Figure 9:
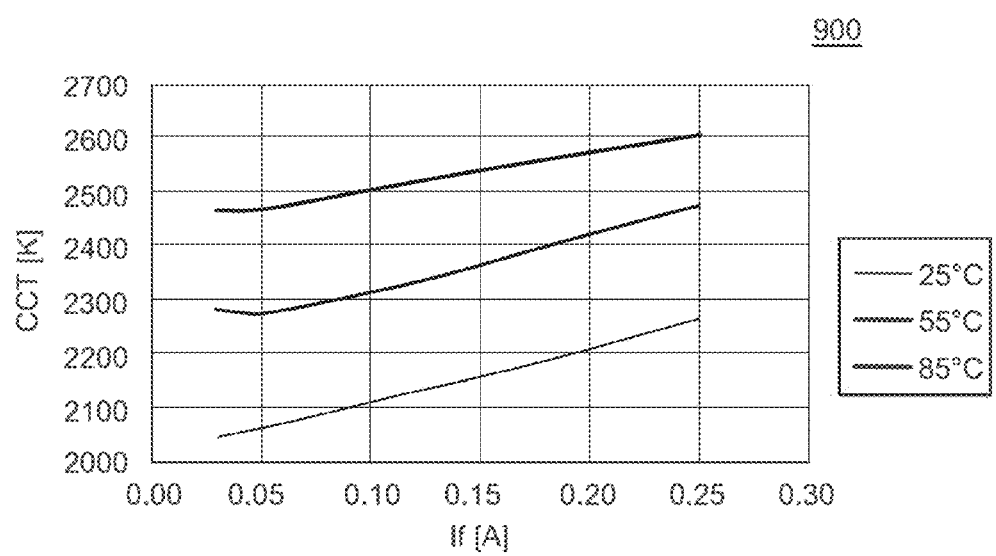

FIGS. 8 and 9 are graphs 800 and 900 illustrating the effect on CCT of light emitted by an LED when the LED includes a porous structure, such as the various porous structures described above. In FIG. 8, the effect of drive current at three different board temperatures is given for a standard chip on board (COB) LED without a porous structure. As shown, the CCT increases somewhat with temperature and current, but the magnitude of the effect is small. From Table 1 below, where "P.S." indicates whether the LED has a porous structure, it can be seen that the differences between the extremes (25° C., 30 mA and 85° C., 300 mA) is very small.

TABLE 1

| P.S. | n | lum | Lm/W | LE | u' | v' | CCT | R9 | Ra |
|---|---|---|---|---|---|---|---|---|---|
| no | 3 25° C._30 mA | 136.5 | 143.6 | 291.7 | 0.263 | 0.526 | 2691 | 59.6 | 91.7 |
| no | 3 85° C._250 mA | 916.0 | 104.7 | 301.0 | 0.260 | 0.527 | 2760 | 46.5 | 89.7 |
| Yes | 9 25° C._30 mA | 98.1 | 103.6 | 262.4 | 0.301 | 0.534 | 2054 | 53.9 | 89.6 |
| Yes | 9 85° C._250 mA | 871.4 | 100.1 | 298.4 | 0.267 | 0.530 | 2606 | 43.2 | 88.9 |

In FIG. 9, the effect of drive current at the three different board temperatures is given for a COB LED with a porous structure. As shown, the color temperature change with temperature and current is much larger, and there is a clear decrease in u' shift and a warmer color spectrum. There are different representations of color space, and one is the 1976 CIE chromaticity diagram where u' and v' are used to represent a point in color space with u' varying from red at larger values (u'≈0.6) to blue-green at smaller values (u'≈0.02) and v'≈0.5.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A light emitting device (LED), comprising:
a light emitting layer; and
a wavelength converting material comprising a plurality of pores and configured to absorb light emitted by the light emitting layer and in response emit light of a longer wavelength; and
a fill material disposed in at least one of the pores in the wavelength converting material, such that one or more of the pores is each entirely filled by fill material if the wavelength converting material is at a first temperature, and only partially filled by fill material if the wavelength converting material is at a second temperature.

2. The LED of claim 1, wherein the absolute value of the ratio of the coefficient of thermal expansion of the fill material to the coefficient of thermal expansion of the phosphor material is at least two.

3. The LED of claim 1, wherein the phosphor material comprising the plurality of pores further comprises one of a ceramic phosphor element or phosphor particles in a transparent or translucent binder or matrix.

4. The LED of claim 1, wherein one or more of the pores is each partially filled with the fill material, wherein remaining volume of the one or more partially filled pores comprises gas or vacuum.

5. The LED of claim 1, wherein the fill material is one of silicone, epoxy, urethane, and mixtures of one or more of silicone, epoxy and urethane.

6. The LED of claim 1, wherein the pores have diameters ranging between one 10 nm to 10 μm, 10 nm to 0.5 μm, or 50 nm to 0.5 μm.

7. The LED of claim 1, wherein the phosphor material has a porosity ranging between one of 0 to 0.8, 0 to 0.5, 0 to 0.1, 0 to 0.05, 0.01 to 0.1, and 0.01 to 0.05.

8. The LED of claim 1, wherein:
the light emitting semiconductor diode structure has a first surface, a second surface opposite the first surface and a plurality of side surfaces,
the phosphor material has a first surface, a second surface opposite the first surface, and a plurality of side surfaces,
the first surface of the phosphor material is disposed adjacent the first surface of the light emitting semiconductor diode structure, and
pores formed in the first surface of the phosphor material contain a silicone having a lower molecular weight or lower index than pores formed in the second surface and side surfaces of the phosphor material.

9. The LED of claim 1, wherein the pores are formed uniformly through an entire thickness of the phosphor material or graded in porosity through at least a portion of the thickness of the phosphor material.

10. The LED of claim 1, wherein:
the plurality of pores include pores formed in a surface of the phosphor material that has pores that at least one of dead end, cross link to pores formed in a surface of the phosphor material, and throat from one surface to at least one other surface of the phosphor material, and pores that are not formed in, and
the one or more pores that contain the fill material are at least one of the pores.

11. The LED of claim 1, comprising:
a coating material disposed as a coating on the phosphor material, the coating comprising a second plurality of pores; and
a second fill material disposed in the pores in the coating;
wherein an absolute value of a ratio of a coefficient of thermal expansion of the second fill material to a coefficient of thermal expansion of the coating material is at least two.

12. A light emitting device (LED) comprising:
a light emitting semiconductor diode structure comprising a light emitting active layer disposed between an n-layer and a p-layer; and
a phosphor material having a first surface adjacent the light emitting semiconductor diode structure and a second surface opposite the first surface of the phosphor material; and
a coating material disposed as a coating on and in direct contact with the second surface of the phosphor material, the coating material including a plurality of pores, at least one of the plurality of pores containing a fill material such that the at least one pore is each entirely filled by fill material if the phosphor material is at a first temperature, and only partially filled by fill material if the phosphor material is at a second temperature.

13. The LED of claim 12, wherein the phosphor material comprises one of a layer of phosphor particles and a ceramic phosphor element.

14. The LED of claim 12, wherein the phosphor material further comprises a plurality of other pores, at least one of the plurality of other pores being filled with the fill material.

15. The LED of claim 12, wherein the coating has an index of refraction that matches that of the phosphor material on which the coating is disposed.

16. The LED of claim 12, wherein the phosphor material comprises one of red emitting $K_2(Ti,Si)F_6$:Mn having an index of refraction of approximately 1.4, yellow-green emitting garnets having an index of refraction of approximately 1.8, and orange-red emitting nitridosilicates having an index of refraction above 2.0, and the coating is formed from a material comprising one of silica having an index of refraction of approximately 1.4, AlOX having an index of refraction of approximately 1.8, and SiON or $Si_3N_4$ having an index of refraction above 2.0.

17. The LED of claim 12, wherein the fill material is a silicone material.

18. The LED of claim 12, wherein the one or more of the pores is each entirely filled by fill material if the phosphor material is at a temperature of at least 125° C. and only partially filled by fill material if the phosphor material is at a temperature of 30° C.

19. The LED of claim 12, wherein the pores have diameters ranging between one of 10 nm to 10 µm, 10 nm to 0.5 µm, or 50 nm to 0.5 µm.

20. The LED of claim 12, wherein phosphor material has a porosity ranging between one of 0 to 0.8, 0 to 0.5, 0 to 0.1, 0 to 0.05, 0.01 to 0.1, and 0.01 to 0.05.

* * * * *